US012563949B2

(12) United States Patent
Bai et al.

(10) Patent No.: US 12,563,949 B2
(45) Date of Patent: Feb. 24, 2026

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lu Bai, Beijing (CN); Bo Zhang, Beijing (CN); Jiaxing Chen, Beijing (CN); Yang Zhou, Beijing (CN); Zhiwen Chu, Beijing (CN)

(73) Assignees: Chengdu BOE Optoelectronics Technology Co., Ltd., Sichuan (CN); BOE Technology Group Co., Ltd, Beijing (CN)

( * ) Notice: Subject to any disclaimer, the term of this patent is extended or adjusted under 35 U.S.C. 154(b) by 446 days.

(21) Appl. No.: 18/267,538

(22) PCT Filed: Nov. 26, 2021

(86) PCT No.: PCT/CN2021/133450
§ 371 (c)(1),
(2) Date: Jun. 15, 2023

(87) PCT Pub. No.: WO2023/092444
PCT Pub. Date: Jun. 1, 2023

(65) Prior Publication Data
US 2024/0057452 A1 Feb. 15, 2024

(51) Int. Cl.
*H10K 59/80* (2023.01)
*H10K 59/131* (2023.01)

(52) U.S. Cl.
CPC ......... *H10K 59/873* (2023.02); *H10K 59/131* (2023.02)

(58) Field of Classification Search
None
See application file for complete search history.

(56) References Cited

U.S. PATENT DOCUMENTS

2019/0341439 A1* 11/2019 Choi .................... H10K 59/131

FOREIGN PATENT DOCUMENTS

CN 106098724 A 11/2016
CN 106653818 A 5/2017
(Continued)

*Primary Examiner* — Kyoung Lee
(74) *Attorney, Agent, or Firm* — HOUTTEMAN LAW LLC

(57) ABSTRACT

A display substrate includes a base substrate and a blocking structure on the base substrate and in a non-display region, and further includes first and second conductive layers, and an anode conductive layer on the base substrate and sequentially arranged away from the base substrate; the first conductive layer and the anode conductive layer have first and second boundary lines, respectively; extending directions of the first and second boundary lines are substantially parallel to each other; the second boundary line is on a side of the first boundary line away from the display region; in the fan-out region, the first conductive layer terminates, and the second conductive layer is continuously arranged; in the corner region, the anode conductive layer terminates, and an orthographic projection of the blocking structure on the base substrate at least partially covers an orthographic projection of the first and second boundary lines on the base substrate.

20 Claims, 6 Drawing Sheets

(56)        References Cited

FOREIGN PATENT DOCUMENTS

| CN | 106816456 | A | 6/2017 |
| CN | 107464828 | A | 12/2017 |
| CN | 208904069 | U | 5/2019 |
| CN | 110690365 | A | 1/2020 |
| CN | 110875440 | A | 3/2020 |
| CN | 112310181 | A | 2/2021 |
| CN | 113130822 | A | 7/2021 |
| CN | 113284935 | A | 8/2021 |
| KR | 20050025781 | A | 3/2005 |
| TW | 202107700 | A | 2/2021 |
| WO | WO2020248257 | A1 | 12/2020 |
| WO | WO2021062588 | A1 | 4/2021 |
| WO | WO2021102626 | A1 | 6/2021 |

* cited by examiner

DISPLAY SUBSTRATE AND DISPLAY APPARATUS

TECHNICAL FIELD

The present disclosure belongs to the field of display technology, and particularly relates to a display substrate and a display apparatus.

BACKGROUND

An Organic Light-Emitting Diodes (OLED) display panel and a Quantum Dot Light Emitting Diodes (QLED) display panel generally each employ Chemical Vapor Deposition (CVD) process to form an encapsulation layer, which protects the light-emitting devices in the display panel to ensure that the light-emitting devices do not undergo an oxidation reaction with the outside.

However, if the encapsulation fails, for example, if the encapsulation layer is broken, a crack is generated in the encapsulation layer, or the like, moisture will enters the inside of the OLED or QLED panel along the crack, so that the organic light-emitting layer of the light-emitting device is oxidized and fails, and cannot emit light normally. With the continuous invasion of moisture, more and more light-emitting devices cannot emit light normally, and the OLED or QLED panel will have a defect of a continuously enlarged dark spot, which affects the display effect.

SUMMARY

The present disclosure aims to solve at least one technical problem in the prior art and provides a display substrate and a display apparatus.

In a first aspect, an embodiment of the present disclosure provides a display substrate having a display region and a non-display region surrounding the display region, where the display substrate includes a base substrate and a blocking structure on the base substrate and in the non-display region; the display substrate further includes a first conductive layer, a second conductive layer, and an anode conductive layer, which are on the base substrate and sequentially arranged along a direction away from the base substrate; the first conductive layer has a first boundary line; the anode conductive layer has a second boundary line, which has an extending direction substantially parallel to an extending direction of the first boundary line; the second boundary line is on a side of the first boundary line away from the display region; the non-display region includes a fan-out region on a side of the display region, and a corner region connected to the fan-out region;

in the fan-out region, the first conductive layer terminates, and the second conductive layer is continuously arranged; and in the corner region, the anode conductive layer terminates, and an orthographic projection of the blocking structure on the base substrate at least partially covers an orthographic projection of each of the first boundary line and the second boundary line on the base substrate.

Optionally, the blocking structure includes a first blocking dam; and an orthographic projection of the first blocking dam on the base substrate at least partially covers the orthographic projection of the first boundary line and the second boundary line on the base substrate.

Optionally, the first conductive layer further has a third boundary line, which has an extending direction substantially parallel to the extending direction of the first boundary line; the third boundary line is on a side of the first boundary line away from the display region; and the anode conductive layer further has a fourth boundary line, which has an extending direction substantially parallel to the extending direction of the second boundary line; the fourth boundary line is located on a side of the second boundary line away from the display region, and the fourth boundary line is located on a side of the third boundary line away from the display region.

Optionally, the blocking structure further includes a second blocking dam on a side of the first blocking dam away from the display region; and an orthographic projection of the second blocking dam on the base substrate at least partially covers an orthographic projection of each of the third boundary line and the fourth boundary line on the base substrate.

Optionally, the first conductive layer further has a first connection line connecting the first boundary line and the third boundary line; the anode conductive layer further has a second connection line connecting the second boundary line and the fourth boundary line; the second connection line is located on a side of the first connection line close to the fan-out region;

an included angle between an extending direction of the first connection line and each of the extending directions of the first boundary line and the third boundary line is greater than or equal to 90 degrees; and an included angle between an extension direction of the second connection line and each of the extending directions of the second boundary line and the fourth boundary line is greater than or equal to 90 degrees.

Optionally, the first conductive layer further has a fifth boundary line, which has an extending direction substantially parallel to the extending direction of the third boundary line; the fifth boundary line is on a side of the third boundary line away from the display region; and the anode conductive layer further has a sixth boundary line, which has an extending direction substantially parallel to the extending direction of the fourth boundary line; the sixth boundary line is located on a side of the fourth boundary line away from the display region, and the sixth boundary line is located on a side of the fifth boundary line away from the display region.

Optionally, the display substrate further includes an intercepting structure on the base substrate and in the non-display region; and the intercepting structure is farther from the display region than the second blocking dam.

Optionally, an orthographic projection of the intercepting structure on the base substrate at least partly covers an orthographic projection of each of the fifth boundary line and the sixth boundary line on the base substrate.

Optionally, the first conductive layer further has a third connection line connecting the third boundary line and the fifth boundary line; the anode conductive layer further has a fourth connection line connecting the fourth boundary line and the sixth boundary line; the fourth connection line is located on a side of the third connection line close to the fan-out region;

an included angle between an extending direction of the third connection line and each of the extending directions of the third boundary line and the fifth boundary line is greater than or equal to 90 degrees; and an included angle between an extending direction of the fourth connection line and each of the extending directions of the fourth boundary line and the extending direction of the sixth boundary line is greater than or equal to 90 degrees.

Optionally, the first conductive layer further has a seventh boundary line substantially, which has an extending direction parallel to the extending direction of the third boundary line; the seventh boundary line is between the first boundary line and the third boundary line; and the anode conductive layer further has an eighth boundary line, which has an extending direction substantially parallel to the extending direction of the fourth boundary line; the eighth boundary line is between the second boundary line and the fourth boundary line, and the eighth boundary line is on a side of the seventh boundary line away from the display region.

Optionally, the first blocking dam includes a first blocking sub-dam and a second blocking sub-dam; the first blocking sub-dam is closer to the display region than the second blocking sub-dam;

an orthographic projection of the first blocking sub-dam on the base substrate at least partially covers the orthographic projection of the first boundary line and the second boundary line on the base substrate; and an orthographic projection of the second blocking sub-dam on the base substrate at least partially covers an orthographic projection of each of the seventh boundary line and the eighth boundary line on the base substrate.

Optionally, the first conductive layer further has a fifth connection line connecting the first boundary line and the seventh boundary line, and a sixth connection line connecting the third boundary line and the seventh boundary line; the anode conductive layer further has a seventh connection line connecting the second boundary line and the eighth boundary line, and an eighth connection line connecting the fourth boundary line and the eighth boundary line; the seventh connection line is on a side of the fifth connection line close to the fan-out region, and the eighth connection line is on a side of the sixth connection line close to the fan-out region;

an included angle between an extending direction of the fifth connection line and each of the extending directions of the first boundary line and the seventh boundary line is greater than or equal to 90 degrees; an included angle between an extending direction of the sixth connection line and each of the extending directions of the third boundary line and the seventh boundary line is greater than or equal to 90 degrees; and an included angle between an extending direction of the seventh connection line and each of the extending directions of the second boundary line and the eighth boundary line is greater than or equal to 90 degrees; and an included angle between an extending direction of the eighth connection line and each of the extending directions of the fourth boundary line and the extending direction of the eighth boundary line is greater than or equal to 90 degrees.

Optionally, the first conductive layer further has a ninth boundary line, which has an extending direction substantially parallel to the extending direction of the third boundary line; the ninth boundary line is on a side of the third boundary line away from the display region; and the anode conductive layer further has a tenth boundary line, which has an extending direction substantially parallel to the extending direction of the fourth boundary line; the tenth boundary line is on a side of the fourth boundary line away from the display region, and the tenth boundary line is on a side of the ninth boundary line away from the display region.

Optionally, the second blocking dam includes a third blocking sub-dam and a fourth blocking sub-dam; the third blocking sub-dam is closer to the display region than the fourth blocking sub-dam;

an orthographic projection of the third blocking sub-dam on the base substrate at least partially covers the orthographic projection of the third boundary line and the fourth boundary line on the base substrate; and an orthographic projection of the fourth blocking sub-dam on the base substrate at least partially covers an orthographic projection of each of the ninth boundary line and the tenth boundary line on the base substrate.

Optionally, the first conductive layer further has a ninth connection line connecting the third boundary line and the ninth boundary line, and a tenth connection line connecting the fifth boundary line and the ninth boundary line; the anode conductive layer further has an eleventh connection line connecting the fourth boundary line and the tenth boundary line, and a twelfth connection line connecting the sixth boundary line and the tenth boundary line; the eleventh connection line is on a side of the ninth connection line close to the fan-out region, and the twelfth connection line is on a side of the tenth connection line close to the fan-out region;

an included angle between an extending direction of the ninth connection line and each of the extending directions of the third boundary line and the ninth boundary line is greater than or equal to 90 degrees; an included angle between an extending direction of the tenth connection line and each of the extending directions of the fifth boundary line and the ninth boundary line is greater than or equal to 90 degrees;

an included angle between an extending direction of the eleventh connection line and each of the extending directions of the fourth boundary line and the tenth boundary line is greater than or equal to 90 degrees; an included angle between an extending direction of the twelfth connection line and each of the extending directions of the sixth boundary line and the tenth boundary line is greater than or equal to 90 degrees.

Optionally, the display substrate further includes a pixel defining layer on the anode conductive layer; and a thickness of the pixel defining layer is greater in the fan-out region than in the corner region.

Optionally, the display substrate further includes a light-emitting device in a region defined by the pixel defining layer; the light-emitting device includes: a first electrode and a second electrode opposite to each other, and an organic light-emitting layer between the first electrode and the second electrode; and the first electrode and the anode conductive layer are arranged in a same layer.

Optionally, the display substrate further includes a pixel circuit between the base substrate and the anode conductive layer and in the display region; the pixel circuit includes a thin film transistor; the thin film transistor includes: an active layer, a gate insulating layer, a gate, an interlayer insulating layer, and a source and a drain, which are sequentially arranged on the base substrate; the first electrode is electrically connected to the source or the drain through a transitional electrode;

the first conductive layer, and the source and the drain are arranged in a same layer; and the second conductive layer and the transitional electrode are arranged in a same layer.

Optionally, the display substrate further includes a power supply voltage line connected to the second electrode;

the power supply voltage line includes a first power supply voltage sub-line and a second power supply voltage sub-line; and the first power supply voltage sub-line and the first conductive layer are arranged in a same layer; and the second power supply voltage sub-line and the second conductive layer are arranged in a same layer.

Optionally, the display substrate further includes an encapsulation layer on the pixel defining layer; the encapsulation layer includes a first inorganic encapsulation layer, an organic encapsulation layer, and a second inorganic encapsulation layer, which are sequentially arranged along the direction away from the base substrate;

the first inorganic encapsulation layer and the second inorganic encapsulation layer cover the blocking structure and terminate on a side of the blocking structure away from the display region; and the organic encapsulation layer terminates on a side of the blocking structure close to the display region.

Optionally, the display substrate further includes a first organic insulating layer and a second organic insulating layer;

the first organic insulating layer is between the first conductive layer and the second conductive layer; and the second organic insulating layer is between the second conductive layer and the anode conductive layer.

Optionally, each of the first organic insulating layer and the second organic insulating layer is provided with a groove at a corresponding region between the intercepting structure and the blocking structure.

Optionally, the second conductive layer has an eleventh boundary line; and in the corner region, the eleventh boundary line is on a side of the sixth boundary line away from the display region.

Optionally, the first conductive layer further has a twelfth boundary line intersecting the extending direction of the first boundary line; the anode conductive layer further has a thirteen boundary line intersecting the extending direction of the second boundary line; and the twelfth boundary line is in the fan-out region, and the thirteenth boundary line is in the corner region.

Optionally, at least portions of the first conductive layer, the second conductive layer, and the anode conductive layer are electrically connected together in the corner region.

In a second aspect, an embodiment of the present disclosure further provides a display apparatus, which includes any one of the display substrates described above.

BRIEF DESCRIPTION OF DRAWINGS

FIG. 5a is a schematic diagram illustrating an enlarged structure of a corner region of the display substrate shown in FIG. 4a;

DETAIL DESCRIPTION OF EMBODIMENTS

In order to enable one of ordinary skill in the art to better understand the technical solutions of the present disclosure, the present disclosure will be further described in detail below with reference to the accompanying drawings and specific embodiments.

Unless defined otherwise, technical or scientific terms used herein shall have the ordinary meaning as understood by one of ordinary skill in the art to which this disclosure belongs. The use of "first", "second", and the like in the present disclosure is not intended to indicate any order, quantity, or importance, but rather serves to distinguish one element from another. Also, the term "a", "an", "the" or the like does not denote a limitation of quantity, but rather denotes the presence of at least one. The word "comprising", "comprises", or the like means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
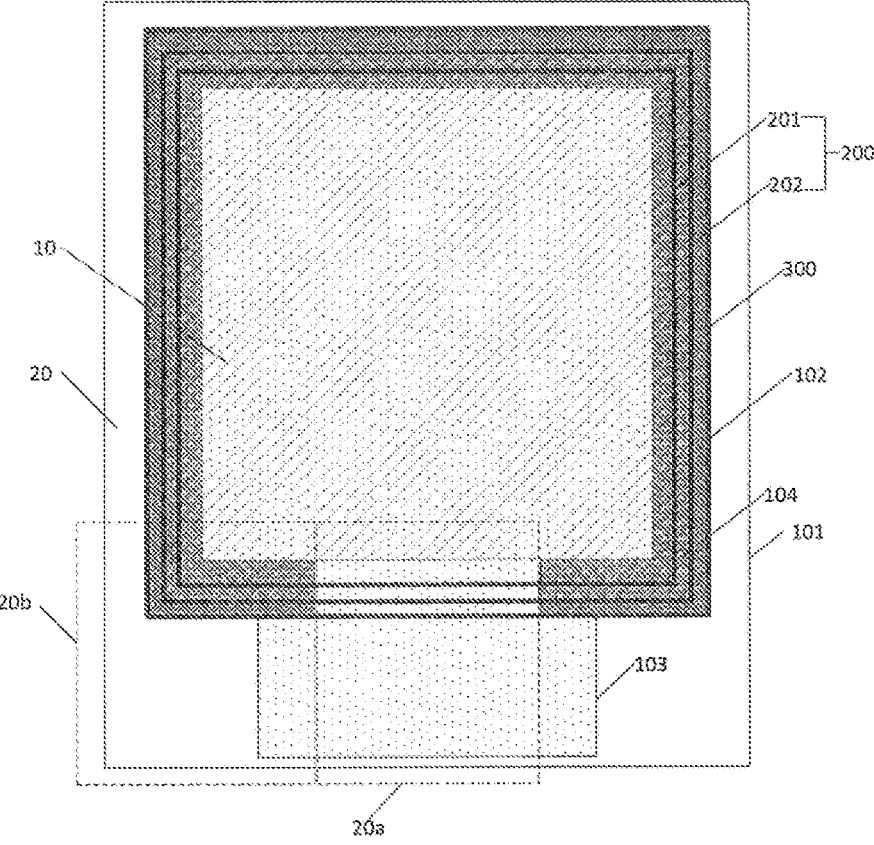
FIG. 1 is a schematic diagram illustrating a structure of an exemplary display substrate.
Figure 2:
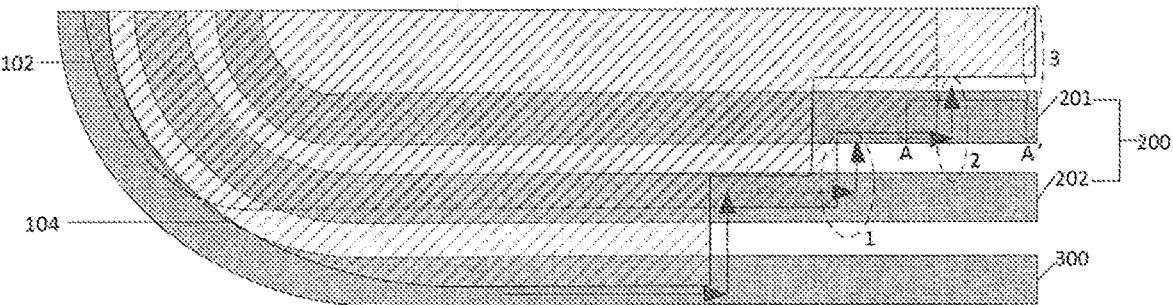
FIG. 2 is a schematic diagram illustrating an enlarged structure of a corner region of the display substrate shown in FIG. 1.

FIG. 1 is a schematic diagram illustrating a structure of an exemplary display substrate, and FIG. 2 is a schematic diagram illustrating an enlarged structure of a corner region of the display substrate shown in FIG. 1. As shown in FIGS. 1 and 2, the display substrate has a display region 10 and a non-display region 20 surrounding the display region 10. The display substrate includes: a base substrate 101; and a blocking structure 200 and an intercepting structure 300 located on the base substrate 101 and arranged in the non-display region 20, where the blocking structure 200 is closer to the display region 10 than the intercepting structure 300. The display substrate further includes a first conductive layer 102, a second conductive layer 103, and an anode conductive layer 104, which are located on the base substrate 101 and sequentially arranged along a direction away from the base substrate 101. The first conductive layer 102 and the second conductive layer 103 may form a layer in respective thin film transistor devices in the display region 10, and may also form a signal line connected to the thin film transistor and the light-emitting device in the display region 10. The anode conductive layer 104 may form anodes of the respective light-emitting devices in the display region 10.

It should be noted that, the above display substrate and subsequent descriptions are illustrated using OLED display substrate as an example. Alternatively, the display substrate may be a QLED display substrate, and the implementation principle thereof is basically the same, and will not be described again.

The first conductive layer 102 and the second conductive layer 103 may extend from the display region 10 into the non-display region 20. Specifically, the first conductive layer 102 and the second conductive layer 103 may form a power supply voltage line, for example, a low-level power supply voltage line VSS. It is understood that the first conductive layer 102 and the second conductive layer 103 may alternatively form other types of signal lines, which are not listed here. The low-level signal line VSS will be taken as an example in the embodiments of the present disclosure and in the following description. Both the blocking structure 200 and the intercepting structure 300 are made of an organic material. Specifically, the blocking structure 200 includes a first blocking dam 201 and a second blocking dam 202.

In a conventional display substrate, two insulating layers are arranged between the first conductive layer 102 and the second conductive layer 103, where one of the two insulating layers is an organic insulating layer and the other of the two insulating layers is an inorganic insulating layer. At present, in order to save the manufacturing cost and improve the productivity of the display substrate, the inorganic insulating layer is usually eliminated. That is, only one organic insulating layer is arranged between the first conductive layer 102 and the second conductive layer 103. In the non-display region 20, in order to reduce the impedance of the signal lines, the low-level power supply line VSS is generally made of a double-layer conductive layer. If only the first conductive layer 102 is used to pass through the blocking structure 200 and the intercepting structure 300 and be connected to the driving chip, in a fan-out region 20a, the second conductive layer 103 is required to terminate in the corner region 20b. However, since the inorganic insulating layer is eliminated, and since the first conductive layer 102 and the second conductive layer 103 are made of a same material, an exposed part of the first conductive layer 102 may be etched when the second conductive layer 103 is etched, which may affect the circuit structure. The second conductive layer 103 is formed after forming the first conductive layer 102, and since the subsequent processes are fewer, an etching depth of the second conductive layer 103 is less than that of the first conductive layer 102. Therefore, only one layer of the second conductive layer 103 must be used to pass through the blocking structure 200 and the intercepting structure 300 and to be connected to the driving chip.

When only the second conductive layer 103 is used to be connected to the driving chip, the first conductive layer 102 is required to be shortened into the display region 10 from a position of the intercepting structure 300, to terminate at a position of the fan-out region 20a, so that only the second conductive layer 103 passes through the blocking structure 200 and the intercepting structure 300 at the position of the fan-out region 20a. Since an organic material layer is often arranged on the first conductive layer 102 to cover the first conductive layer 102, a moisture channel (as indicated by arrows in the figure) is prone to be formed at the positions where the first conductive layer 102 shortens toward the display region 10, namely, at a position 1 and a position 2. Specifically, a boundary line of the first conductive layer 102 is under the intercepting structure 300 and extends to the position 1 along the intercepting structure 300. At the position 1, the first conductive layer 102 is shortened from being under the intercepting structure 300 to being under the second blocking dam 202, and extends to a position 3 along the second blocking dam 202. Meanwhile, the anode conductive layer 104 is shortened from the second blocking dam 202 to a side of the first blocking dam 201 close to the display region 10 at the position 2. At the position 1, the first conductive layer 102 is required to be covered with an organic material layer while extending from the intercepting structure 300 to the second blocking dam 202. At the position 2, the anode conductive layer 104 is shortened from the second blocking dam 202 to the inside of the first blocking dam 201, and is covered with the pixel defining layer; and the first conductive layer 102 is shortened from being under the second blocking dam 202 to being under the first blocking dam 201, and extends to the position 3 along the first blocking dam 201 to be finally shortened into the display region 10. At the position 3, the first conductive layer 102 is not covered with the organic material layer, in order to reduce the moisture channel. It can be seen that the first conductive layer 102 shortens with the shortest path at both position 1 and position 2, forming a moisture channel between the position 1 and the position 2. Once the encapsulation fails, for example, the encapsulation layer is broken, a crack is generated in the encapsulation layer, or the like, moisture will enter the inside of the display substrate through the moisture channel along the crack, so that the organic light-emitting layer of the light-emitting device is oxidized and fails, and cannot emit light normally. With the continuous invasion of moisture, more and more light-emitting devices cannot emit light normally, and the OLED panel will have the defect of continuously enlarged dark spot, which affects the display effect.

Figure 3:
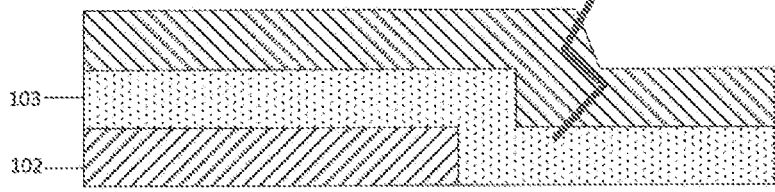
FIG. 3 is a schematic cross-sectional view illustrating a structure of the display substrate shown in FIG. 2 along a line A-A'.

FIG. 3 is a schematic cross-sectional structure view illustrating a structure of the display substrate shown in FIG. 2 at the position 3 along a line A-A'. As shown in FIG. 3, at the position 3, the first conductive layer 102 terminates, but the second conductive layer 103 is still continuously arranged. In this case, the second conductive layer 103 is prone to be broken at this position. Since no anode conductive layer 104 covers, a step is prone to be formed at this position, a crack is prone to be formed in the encapsulation layer thereon at the position of the step, which causes an encapsulation failure, so that moisture enters the inside of the display substrate through the moisture channel, and the organic light-emitting layer of the light-emitting device is oxidized and fails, and cannot emit light normally.

In order to solve at least one of the above technical problems, embodiments of the present disclosure provide a display substrate and a display apparatus, which will be described in further detail below with reference to the accompanying drawings and detailed description.

Figure 4A:
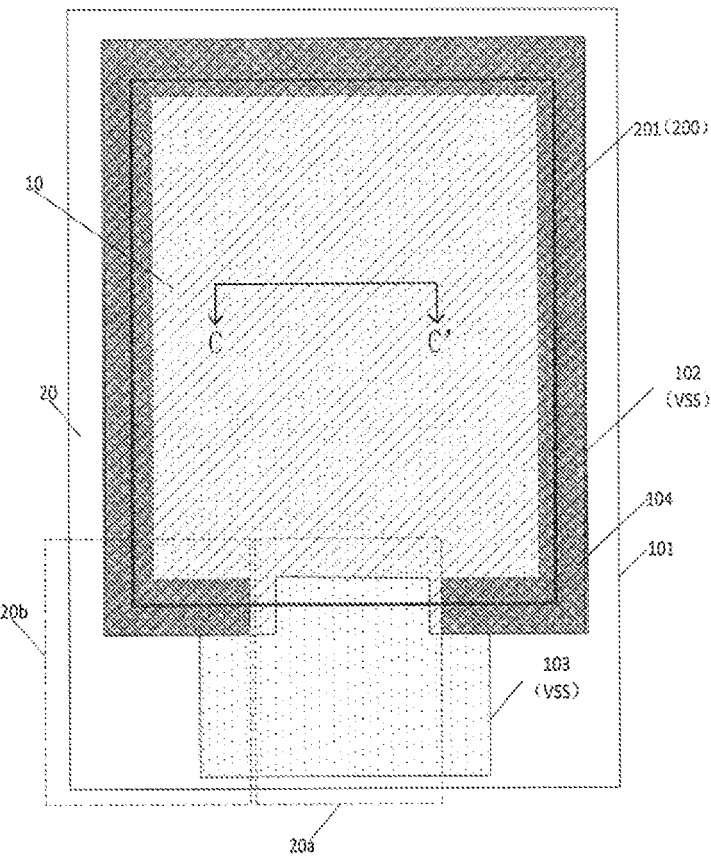
FIG. 4a is a schematic diagram illustrating a structure of a display substrate according to an embodiment of the disclosure.
Figure 5A:
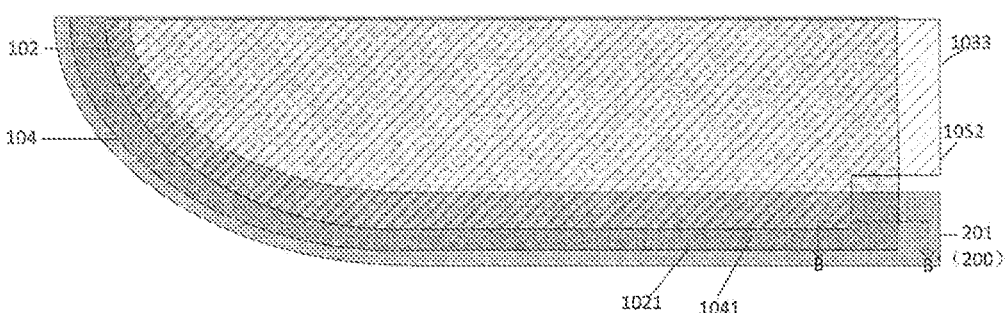

FIG. 4a is a schematic diagram illustrating a structure of a display substrate according to an embodiment of the present disclosure, and FIG. 5a is a diagram illustrating an enlarged structure of a corner region in the display substrate shown in FIG. 4a. It can be understood that FIG. 5a illustrating an embodiment of the present disclosure only shows a structure of a lower left corner region of the display substrate, and a structure of a lower right corner region is similar to that of the lower left corner region. As shown in FIGS. 4a and 5a, a display substrate according to an embodiment of the present disclosure has a display region 10 and a non-display region 20 surrounding the display region 10. The display substrate includes: a base substrate 101; and a blocking structure 200 located on the base substrate 101 and arranged in the non-display region 20. The display substrate further includes a first conductive layer 102, a second conductive layer 103, and an anode conductive layer 104, which are located on the base substrate 101 and sequentially arranged along a direction away from the base substrate 101. The first conductive layer 102 has a first boundary line 1021; and the anode conductive layer 104 has a second boundary line 1041, which has an extending direction substantially parallel to an extending direction of the first boundary line. The second boundary line 1041 is located on a side of the first boundary line 1021 away from the display region 10. The non-display region 20 includes: a fan-out region 20a arranged on a side of the display region 10; and a corner region 20b connected to the fan-out region 20a. In the fan-out region 20a, the first conductive layer 102 terminates, and the second conductive layer 103 is continuously arranged. In the corner region 20b, the anode conductive layer 104 terminates. An orthographic projection of the blocking structure 200 on the base substrate 101 at least partially covers an orthographic projection of each of the first boundary line 1021 and the second boundary line 1041 on the base substrate 101.

For example, the base substrate 101 may be made of a rigid material such as glass, which can improve the carrying capacity of the base substrate 101 for other layers thereon. Alternatively, the base substrate 101 may be made of a flexible material such as Polyimide (PI), which can improve the bending resistance and the tensile resistance of the entire display substrate, and prevent the base substrate 101 from being broken due to the stress generated during the bending, stretching, and twisting processes, thereby preventing the defect of open circuit. In practical applications, the material of the base substrate 101 may be selected reasonably according to actual requirements to ensure that the display substrate has good performance.

The blocking structure 200 may be made of an organic material, such as polyimide, epoxy resin. Moreover, the blocking structure 200 may be made of a single layer structure, or may be made of a multilayer structure. The blocking structure 200 may be formed in the non-display region 20 of the display substrate, and may surround the entire display region 10, so that a crack caused by an external force acting on a layer such as an encapsulation layer in the display substrate terminates at the position of the blocking structure 200, and the crack is prevented from extending from the non-display region 20 to the display region 10, thereby preventing the performance of the light-emitting device in the display region 10 from being affected by the crack.

The first conductive layer 102 and the second conductive layer 103 may be made of a same conductive material, for example, a metal material such as aluminum, titanium, copper, molybdenum. The first conductive layer 102 and the second conductive layer 103 may be made of a single-layer structure or a multi-layer structure, for example, a three-layer metal layer structure such as titanium/aluminum/titanium, molybdenum/aluminum/molybdenum, titanium/copper/titanium, or molybdenum/copper/molybdenum. The first conductive layer 102 and the second conductive layer 103 may extend from the display region 10 to the non-display region 20. Specifically, the first conductive layer 102 and the second conductive layer 103 may form a layer of a thin film transistor in the display region 10, and alternatively may form a signal line for transmitting a signal, such as a power supply voltage line. Specifically, the power supply voltage line may be a low-level power supply voltage line VSS. It is understood that the first conductive layer 102 and the second conductive layer 103 may alternatively form other types of signal lines, which are not listed here. The low-level signal line VSS will be taken as an example in the embodiments of the present disclosure and in the following description.

In the fan-out region 20a, the first conductive layer 102 terminates in a break state, and the second conductive layer 103 passes through the blocking structure 200 in a continuous state. The second conductive layer 103 is used to pass through the blocking structure 200 to be connected to the driving chip. In the corner region 20b, the anode conductive layer 104 terminates. The first conductive layer 102 has a first boundary line 1021, and the anode conductive layer 104 has a second boundary line 1041. In the corner region 20b, the second boundary line 1041 is located on a side of the first boundary line 1021 away from the display region 10, and an orthographic projection of the blocking structure 200 on the base substrate 101 at least partially covers an orthographic projection of each of the first boundary line 1021 and the second boundary line 1041 on the base substrate 101. That is, the blocking structure 200 covers the second boundary line 1041 of the anode conductive layer 104, and the anode conductive layer 104 covers the first boundary line 1021 of the first conductive layer 102. It should be noted that the first boundary line 1021 and the second boundary line 1041 are substantially parallel to each other, where the term "substantially parallel" refers to parallel within the tolerance of process tolerance. In the following description, the meaning of "substantially parallel" is the same, and will not be described in detail.

In the display substrate according to the embodiment of the present disclosure, the blocking structure 200 covers the second boundary line 1041 of the anode conductive layer 104, and the anode conductive layer 104 covers the first boundary line 1021 of the first conductive layer 102. Since the anode conductive layer 104 is generally covered by the pixel defining layer, it is not necessary to separately provide an organic material layer for covering the second boundary line 1041 of the anode conductive layer 104 and the first boundary line 1021 of the first conductive layer 102. Both of the first boundary line 1021 of the first conductive layer 102 and the second boundary line 1041 of the anode conductive layer 104 are located under the blocking structure 200 and extend by a distance toward the fan-out region 20a. That is, both of the first conductive layer 102 and the anode conductive layer 104 are shortened toward the display region 10, without extending to a region outside the blocking structure 200, so that a complete groove in the organic material layer can be ensured, and formation of a moisture channel can be prevented. Therefore, moisture can be prevented from entering the display region 10 of the display substrate through the moisture channel, thereby preventing a failure of an organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 4a and 5a, the blocking structure 200 includes a first blocking dam 201. An orthographic projection of the first blocking dam 201 on the base substrate 101 at least partly covers the orthographic projection of the first boundary line 1021 and the second boundary line 1041 on the base substrate 101.

The blocking structure 200 may be composed of one blocking dam, i.e., the first blocking dam 201. The first boundary line 1021 of the first conductive layer 102 and the second boundary line 1041 of the anode conductive layer 104 are located under the first blocking dam 201 and extend by a distance toward the fan-out region 20a. That is, both of the first conductive layer 102 and the anode conductive layer 104 are shortened toward the display region 10, without extending to a region outside the blocking structure 200, so that a complete groove in the organic material layer can be ensured, and formation of a moisture channel can be prevented. Therefore, moisture can be prevented from entering the display region 10 of the display substrate through the moisture channel, thereby preventing a failure of an organic light-emitting layer of the light-emitting device from being caused by the moisture, so that the defect of a continuously enlarged dark spot is prevented from occurring due to the failure of the organic light-emitting layer, thereby improving the display effect of the display substrate.

Figure 4B:
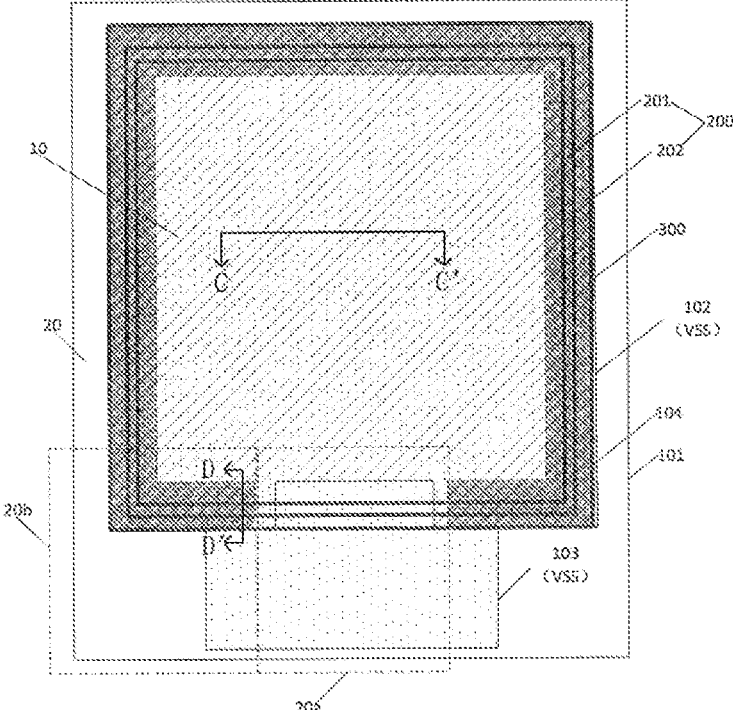
FIG. 4b is a schematic diagram illustrating a structure of another display substrate according to an embodiment of the present disclosure.
Figure 4C:
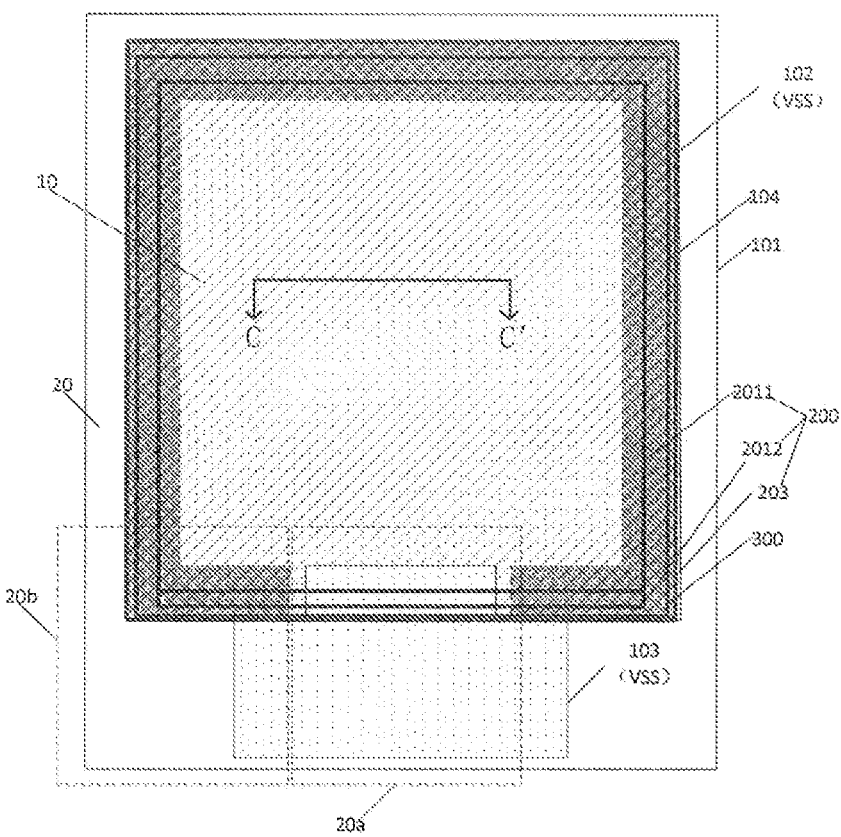
FIG. 4c is a schematic diagram illustrating a structure of another display substrate according to an embodiment of the present disclosure.
Figure 4D:
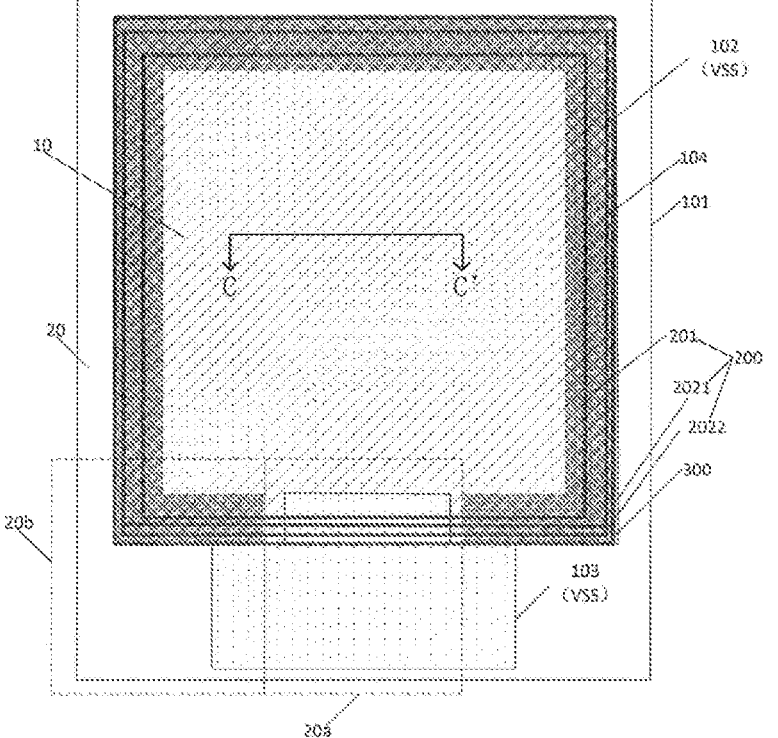
FIG. 4d is a schematic diagram illustrating a structure of another display substrate according to an embodiment of the disclosure.
Figure 5B:
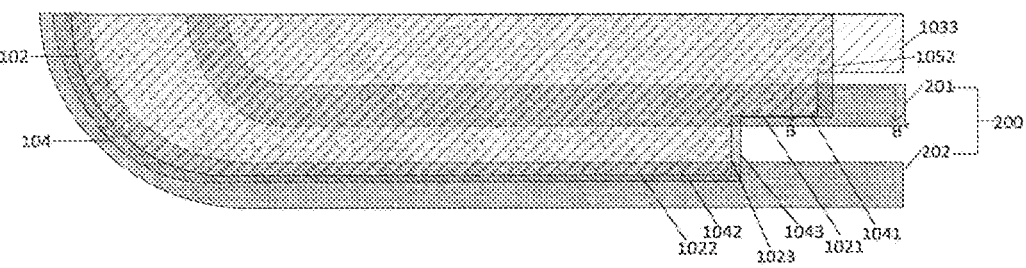
FIGS. 5b to 5e are schematic diagrams each illustrating an enlarged structure of a corner region of the display substrate shown in FIG. 4b.

In some embodiments, as shown in FIGS. 4b and 5b, the first conductive layer 102 further has a third boundary line 1022, which has an extending direction substantially parallel to the extending direction of the first boundary line 1021. The third boundary line 1022 is located on a side of the first boundary line 1021 away from the display region 10. The anode conductive layer 104 further has a fourth boundary line 1042, which has an extending direction substantially parallel to the extending direction of the second boundary line 1041. The fourth boundary line 1042 is located on a side of the second boundary line 1041 away from the display region 10, and the fourth boundary line 1042 is located on a side of the third boundary line 1022 away from the display region 10.

The third boundary line 1022 of the first conductive layer 102 and the fourth boundary line 1042 of the anode conductive layer 104 each extend by a distance toward the fan-out region 20a, and then the first conductive layer 102 and the anode conductive layer 104 each are shortened toward the first blocking dam 201. Then, the third boundary line 1022 of the first conductive layer 102 is connected to the first boundary line 1021, and the fourth boundary line 1042 of the anode conductive layer 104 is connected to the second boundary line 1041. Moreover, the anode conductive layer 104 covers the third boundary line 1022 of the first conductive layer 102. It can be seen that, both of the first conductive layer 102 and the anode conductive layer 104 are shortened twice and extend by a distance toward the fan-out region 20a, so that the first conductive layer 102 is not required to be directly shortened into the display region 10 by the shortest path, a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 4b and 5b, the blocking structure 200 further includes a second blocking dam 202. The second blocking dam 202 is located on a side of the first blocking dam 201 away from the display region 10. An orthographic projection of the second blocking dam 202 on the base substrate 101 at least partially covers an orthographic projection of each of the third boundary line 1022 and the fourth boundary line 1042 on the base substrate 101.

Specifically, unlike the structure of the display substrate shown in FIG. 5a described above, the blocking structure 200 in the display substrate shown in FIG. 5b may include two blocking dams, i.e., the first blocking dam 201 and the second blocking dam 202. The second blocking dam 202 is farther from the display region 10 than the first blocking dam 201. Both of the third boundary line 1022 of the first conductive layer 102 and the fourth boundary line 1042 of the anode conductive layer 104 are located under the second blocking dam 202, extend by a distance toward the fan-out region 20a and then are shortened to be under the first blocking dam 201, and then extend by a distance toward the fan-out region 20a and then are shortened into the display region 10, which shows that both of the first conductive layer 102 and the anode conductive layer 104 are shortened twice, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. On the other hand, a complete groove in the organic material layer can be ensured, and formation of a moisture channel can be prevented.

Figure 5C:
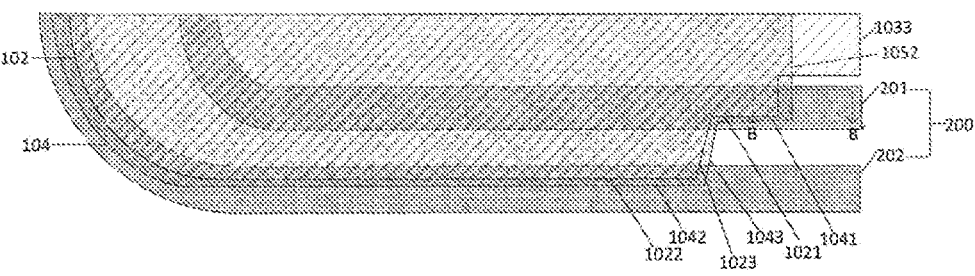

In some embodiments, as shown in FIGS. 5b and 5c, the first conductive layer 102 further has a first connection line 1023 connecting the first boundary line 1021 and the third boundary line 1022; and the anode conductive layer 104 further has a second connection line 1043 connecting the second boundary line 1041 and the fourth boundary line 1042. The second connection line 1043 is located on a side of the first connection line 1023 close to the fan-out region 20a. An included angle between an extending direction of the first connection line 1023 and each of extending directions of the first boundary line 1021 and the third boundary line 1022 is greater than or equal to 90 degrees; and an included angle between an extending direction of the second connection line 1043 and each of extending directions of the second boundary line 1041 and the fourth boundary line 1042 is greater than or equal to 90 degrees.

It should be noted that the boundary lines and the connection lines in the display substrate according to an embodiment of the present disclosure are formed due to shortening the layers such as the first conductive layer 102 and the anode conductive layer 104 toward the display region in the corner region 20b. As shown in FIG. 5c, the extending direction of the first connection line 1023 is neither perpendicular to the extending direction of the first boundary line 1021 nor perpendicular to the extending direction of the third boundary line 1022, and the extending direction of the second connection line 1043 is neither perpendicular to the extending direction of the second boundary line 1041 nor perpendicular to the extending direction of the fourth boundary line 1042. That is, both of the first connection line 1023 and the second connection line 1043 are arranged oblique, so that a distance of each of the first connection line 1023 and the second connection line 1043 can be extended, a distance of a possibly formed moisture channel can be further extended, the invasion of moisture can be delayed, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. It can be understood that, as shown in FIG. 5*b*, the extending direction of the first connection line 1023 may alternatively be perpendicular to each of the extending directions of the first boundary line 1021 and the third boundary line 1022, and the extending direction of the second connection line 1043 may alternatively be perpendicular to each of the extending directions of the second boundary line 1041 and the fourth boundary line 1042, so that the difficulty of forming the first conductive layer 102 and the anode conductive layer 104 can be reduced, the materials of the first conductive layer 102 and the anode conductive layer 104 can be saved, thereby saving the manufacturing cost.

Figure 5D:
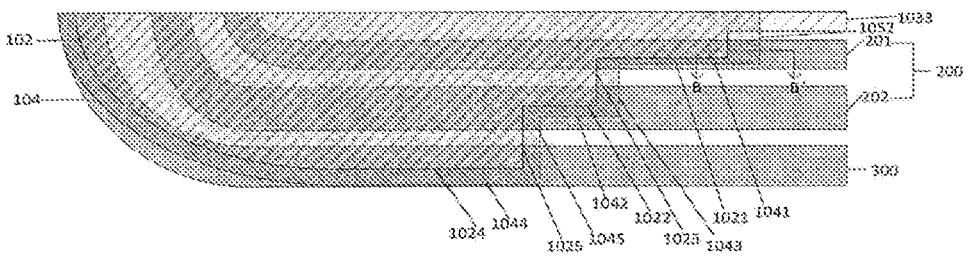
Figure 5E:
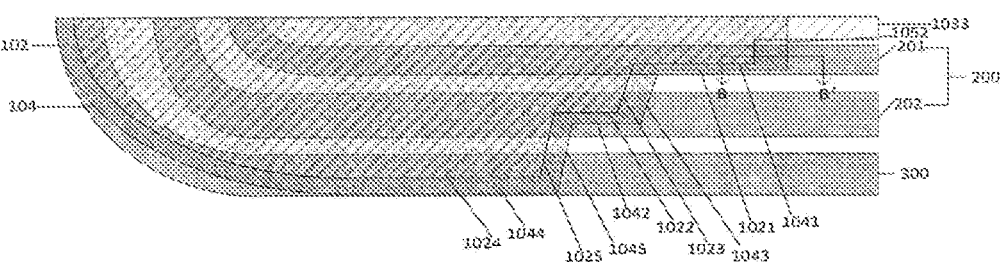

In some embodiments, as shown in FIGS. 5*d* and 5*e*, the first conductive layer 102 further has a fifth boundary line 1024, which has an extending direction substantially parallel to the extending direction of the third boundary line 1022. The fifth boundary line 1024 is located on a side of the third boundary line 1022 away from the display region 10. The anode conductive layer 104 further has a sixth boundary line 1044, which has an extending direction substantially parallel to the extending direction of the fourth boundary lines 1042. The sixth boundary line 1044 is located on a side of the fourth boundary line 1042 away from the display region, and the sixth boundary line 1044 is located on a side of the fifth boundary line 1024 away from the display region.

The fifth boundary line 1024 of the first conductive layer 102 may extend by a distance toward the fan-out region 20*a*, and then be shortened toward the second blocking dam 202 to form the third boundary line 1022. The third boundary line 1022 may be shortened toward the first blocking dam 201, and extend by a distance toward the fan-out region 20*a* to form the first boundary line 1021. Then, the first boundary line 1021 may be shortened into the display region 10. Accordingly, the sixth boundary line 1044 of the anode conductive layer 103 may also extend by a distance toward the fan-out region 20*a*, and then be shortened toward the second blocking dam 202 to form the fourth boundary line 1042. The fourth boundary line 1042 may be shortened toward the first blocking dam 201, and extend by a distance toward the fan-out region 20*a* to form the second boundary line 1041. Then, the second boundary line 1041 may be shortened into the display region 10. It can be seen that, both of the first conductive layer 102 and the anode conductive layer 104 are shortened three times, and extend by a distance toward the fan-out region 20*a* after being shortened, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 5*d* and 5*e*, the display substrate further includes an intercepting structure 300 located on the base substrate 101 and arranged in the non-display region 20. The intercepting structure 300 is farther from the display region 10 than the second blocking dam 202. An orthographic projection of the intercepting structure 300 on the base substrate 101 at least partly covers an orthographic projection of each of the fifth boundary line 1024 and the sixth boundary line 1044 on the base substrate 101.

The fifth boundary line 1024 of the first conductive layer 102 may be under the intercepting structure 300 and extend by a distance toward the fan-out region 20*a*, and then be shortened toward the second blocking dam 202 to form the third boundary line 1022. The third boundary line may be shortened toward the first blocking dam 201 and extend by a distance toward the fan-out region 20*a* to form the first boundary line 1021. Then, the first boundary line 1021 may be shortened into the display region 10. Accordingly, the sixth boundary line 1044 of the anode conductive layer 103 may also be under the intercepting structure 300 and extend by a distance toward the fan-out region 20*a*, and then be shortened toward the second blocking dam 202 to form a fourth boundary line 1042. The fourth boundary line 1042 may be shortened toward the first blocking dam 201 and extend by a distance toward the fan-out region 20*a* to form the second boundary line 1041. Then, the second boundary line 1041 may be shortened into the display region 10. It can be seen that, both of the first conductive layer 102 and the anode conductive layer 104 are shortened three times, and extend by a distance toward the fan-out region 20*a* after being shortened, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 5*d* and 5*e*, the first conductive layer 102 further has a third connection line 1025 connecting the third boundary line 1022 and the fifth boundary line 1024; and the anode conductive layer 104 further has a fourth connection line 1045 connecting the fourth boundary line 1042 and the sixth boundary line 1044. The fourth connection line 1045 is located on a side of the third connection line 1025 close to the fan-out region 20*a*. An included angle between the extending direction of the third connection line 1025 and each of extending directions of the third boundary line 1022 and the fifth boundary line 1024 is greater than or equal to 90 degrees; and an included angle between the extending direction of the fourth connection line 1045 and each of extending directions of the fourth boundary line 1042 and the sixth boundary line 1044 is greater than or equal to 90 degrees.

As shown in FIG. 5*e*, the extending direction of the third connection line 1025 is neither perpendicular to the extending direction of the third boundary line 1022 nor perpendicular to the extending direction of the fifth boundary line 1024, and the extending direction of the fourth connection line 1045 is neither perpendicular to the extending direction of the fourth boundary line 1042 nor perpendicular to the extending direction of the sixth boundary line 1044. That is, both of the third connection line 1025 and the fourth connection line 1045 are arranged oblique, so that distances of the third connection line 1025 and the fourth connection line 1045 can be extended, a distance of a possibly formed moisture channel can be further extended, the invasion of moisture can be delayed, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. It is understood that, as shown in FIG. 5d, the extending direction of the third connection line 1025 may alternatively be perpendicular to each of the extending directions of the third boundary line 1022 and the fifth boundary line 1024, and the extending direction of the fourth connection line 1045 may alternatively be perpendicular to each of the extending directions of the fourth boundary line 1042 and the sixth boundary line 1044, so that the difficulty of forming the first conductive layer 102 and the anode conductive layer 104 can be reduced, and the materials of the first conductive layer 102 and the anode conductive layer 104 can be saved, thereby saving the manufacturing cost.

Figure 5F:
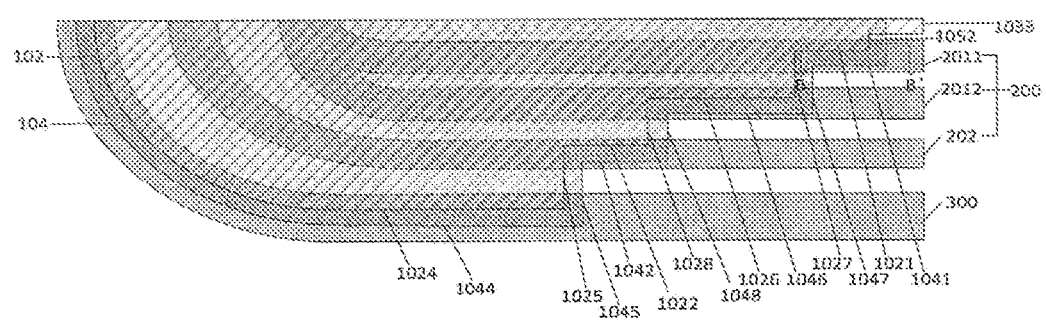
FIGS. 5f to 5g are schematic diagrams each illustrating an enlarged structure of a corner region of the display substrate shown in FIG. 4c.
Figure 5G:
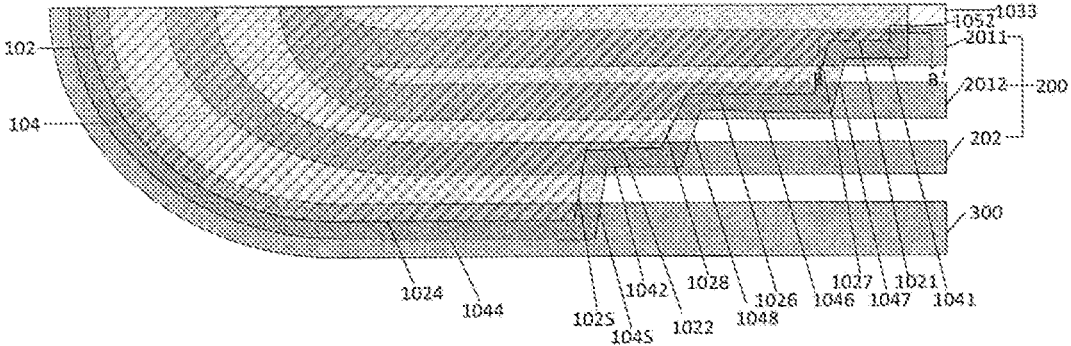

In some embodiments, as shown in FIGS. 5f and 5g, the first conductive layer 102 further has a seventh boundary line 1026, which has an extending direction substantially parallel to the extension direction of the third boundary line 1022. The seventh boundary line 1026 is located between the first boundary line 1021 and the third boundary line 1022. The anode conductive layer 104 further has an eighth boundary line 1046, which has an extending direction substantially parallel to the extending direction of the fourth boundary line 1042. The eighth boundary line 1046 is located between the second boundary line 1041 and the fourth boundary line 1042, and the eighth boundary line 1046 is located on a side of the seventh boundary line 1026 away from the display region 10.

The fifth boundary line 1024 of the first conductive layer 102 is shortened to form the third boundary line 1022. The third boundary line 1022 may extend by a distance toward the fan-out region 20a, and then be shortened to form the seventh boundary line 1026. The seventh boundary line 1026 is shortened and extends by a distance toward the fan-out region 20a to form the first boundary line 1021. The first boundary line 1021 is shortened into the display region 10. Accordingly, the sixth boundary line 1044 of the anode conductive layer 103 is shortened to form the fourth boundary line 1042. The fourth boundary line 1042 may extend by a distance toward the fan-out region 20a, and then be shortened to form the eighth boundary line 1046. The eighth boundary line 1046 is shortened and extends by a distance toward the fan-out region 20a to form the second boundary line 1041. The second boundary line 1041 is shortened into the display region 10. It can be seen that the first conductive layer 102 and the anode conductive layer 104 are shortened four times and extend by a distance toward the fan-out region 20a after being shortened, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 5f and 5g, the first blocking dam 201 includes a first blocking sub-dam 2011 and a second blocking sub-dam 2012. The first blocking sub-dam 2011 is closer to the display region 10 than the second blocking sub-dam 2012. An orthographic projection of the first blocking sub-dam 2011 on the base substrate 101 at least partially covers the an orthographic projection of the first boundary line 1021 and the second boundary line 1041 on the base substrate 101; and an orthographic projection of the second blocking sub-dam 2012 on the base substrate 101 at least partially covers an orthographic projection of each of the seventh boundary line 1026 and the eighth boundary line 1046 on the base substrate 101.

The first blocking dam 201 may be composed of the first blocking sub-dam 2011 and the second blocking sub-dam 2022, and ends of the first blocking sub-dam 2011 and the second blocking sub-dam 2012 away from the fan-out region 20a are connected together. The seventh boundary line 1026 of the first conductive layer 102 may be under the second blocking sub-dam 2012. The seventh boundary line 1026 may be shortened to form the first boundary line 1021, and the first boundary line 1021 may be under the first blocking sub-dam 2011. Accordingly, the eighth boundary line 1046 of the anode conductive layer 104 may be under the second blocking sub-dam 2012. The eighth boundary line 1046 may be shortened to form the second boundary line 1041, and the second boundary line 1041 may be under the first blocking sub-dam 2011. Therefore, both of the first conductive layer 102 and the anode conductive layer 104 are shortened four times, and extend by a distance toward the fan-out region 20a after being shortened, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 5f and 5g, the first conductive layer 102 further has a fifth connection line 1027 connecting the first boundary line 1021 and the seventh boundary line 1026, and a sixth connection line 1028 connecting the third boundary line 1022 and the seventh boundary line 1026. The anode conductive layer 104 further has a seventh connection line 1047 connecting the second boundary line 1041 and the eighth boundary line 1046, and an eighth connection line 1048 connecting the fourth boundary line 1042 and the eighth boundary line 1046. The seventh connection line 1047 is located on a side of the fifth connection line 1027 close to the fan-out region 20a, and the eighth connection line 1048 is located on a side of the sixth connection line 1028 close to the fan-out region 20a. An included angle between an extending direction of the fifth connection line 1027 and each of extending directions of the first boundary line 1021 and the seventh boundary line 1026 is greater than or equal to 90 degrees; an included angle between an extending direction of the sixth connection line 1028 and each of extending directions of the third boundary line 1022 and the seventh boundary line 1026 is greater than or equal to 90 degrees; an included angle between an extending direction of the seventh connection line 1047 and each of extending directions of the second boundary line 1041 and the eighth boundary line 1046 is greater than or equal to 90 degrees; and an included angle between an extending direction of the eighth connection line 1048 and each of extending directions of the fourth boundary line 1042 and the eighth boundary line 1046 is greater than or equal to 90 degrees.

As shown in FIG. 5g, the extending direction of the fifth connection line 1027 is neither perpendicular to the extending direction of the first boundary line 1021 nor perpendicular to the extending direction of the seventh boundary line 1026, and the extending direction of the sixth connection line 1028 is neither perpendicular to the extending direction of the third boundary line 1022 nor perpendicular to the extending direction of the seventh boundary line 1026. That is, both of the fifth connection line 1027 and the sixth connection line 1028 are arranged oblique, so that the distances of the fifth connection line 1027 and the sixth connection line 1028 can be increased, a distance of a possibly formed moisture channel can be further extended, the invasion of moisture can be delayed, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. Similarly, the seventh connection line 1047 and the eighth connection line 1048 may also be arranged oblique, so that distances of the seventh connection line 1047 and the eighth connection line 1048 can be increased, a distance of a possibly formed moisture channel can be further extended, the invasion of moisture can be delayed, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. It can be understood that, as shown in FIG. 5f, each of the fifth connection line 1027, the sixth connection line 1028, the seventh connection line 1047, and the eighth connection line 1048 may alternatively be arranged perpendicular to a corresponding boundary line thereof, so that the difficulty of forming the first conductive layer 102 and the anode conductive layer 104 can be reduced, and the materials of the first conductive layer 102 and the anode conductive layer 104 can be saved, thereby saving the manufacturing cost.

Figure 5H:
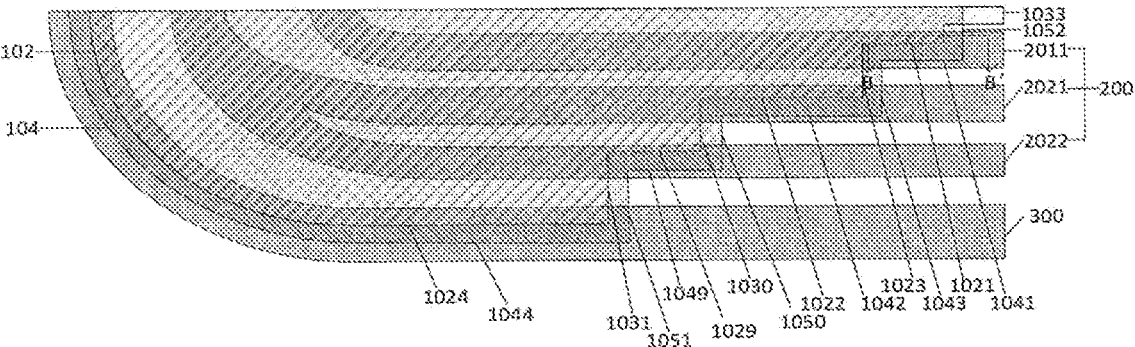
FIGS. 5h to 5i are schematic diagrams each illustrating an enlarged structure of a corner region of the display substrate shown in FIG. 4d.
Figure 5I:
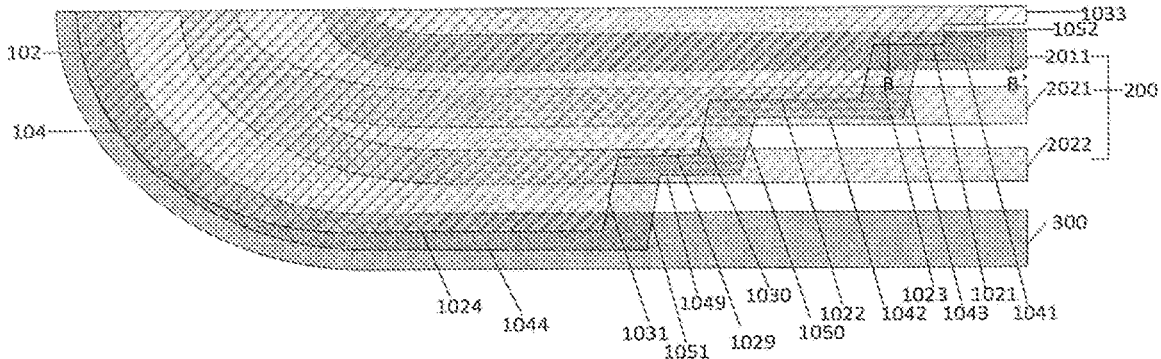

In some embodiments, as shown in FIGS. 5h and 5i, the first conductive layer 102 further has a ninth boundary line 1029, which has an extending direction substantially parallel to the extension direction of the third boundary line 1022. The ninth boundary line 1029 is located on a side of the third boundary line 1022 away from the display region 10. The anode conductive layer 104 further has a tenth boundary line 1049, which has an extending direction substantially parallel to the extending direction of the fourth boundary line 1042. The tenth boundary line 1049 is located on a side of the fourth boundary line 1042 away from the display region 10, and the tenth boundary line 1049 is located on a side of the ninth boundary line 1029 away from the display region 10.

The fifth boundary line 1024 of the first conductive layer 102 may extend by a distance toward the fan-out region 20a, and then be shortened to form the ninth boundary line 1029. The ninth boundary line 1029 is shortened and extends by a distance toward the fan-out region 20a, and then forms the third boundary line 1022. The third boundary line 1022 is shortened to form the first boundary line 1021, and the first boundary line 1021 is shortened into the display region 10. Accordingly, the sixth boundary line 1044 of the anode conductive layer 103 may extend by a distance toward the fan-out region 20a and then be shortened to form the tenth boundary line 1049. The tenth boundary line 1049 is shortened and extends by a distance toward the fan-out region 20a, and then forms the fourth boundary line 1042. The fourth boundary line 1042 is shortened to form the second boundary line 1041, and the second boundary line 1041 is shortened into the display region 10. It can be seen that both of the first conductive layer 102 and the anode conductive layer 104 are shortened four times and extend by a distance toward the fan-out region 20a after being shortened, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 5h and 5i, the second blocking dam 202 includes a third blocking sub-dam 2021 and a fourth blocking sub-dam 2022. The third blocking sub-dam 2021 is closer to the display region 10 than the fourth blocking sub-dam 2022. An orthographic projection of the third blocking sub-dam 2021 on the base substrate 101 at least partially covers an orthographic projection of each of the third boundary line 1022 and the fourth boundary line 1042 on the base substrate 101; and an orthographic projection of the fourth blocking sub-dam 2022 on the base substrate 101 at least partially covers an orthographic projections of the ninth boundary line 1029 and the tenth boundary line 1049 on the base substrate 101.

The second blocking dam 202 may be composed of the third blocking sub-dam 2021 and the fourth blocking sub-dam 2022, and ends of the third blocking sub-dam 2021 and the fourth blocking sub-dam 2022 away from the fan-out region 20a are connected together. The ninth boundary line 1029 of the first conductive layer 102 may be under the fourth blocking sub-dam 2022. The ninth boundary line 1029 may be shortened to form the third boundary line 1022, and the third boundary line 1022 may be under the third blocking sub-dam 2021. Accordingly, the tenth boundary line 1049 of the anode conductive layer 104 may be under the fourth blocking sub-dam 2022. The tenth boundary line 1049 may be shortened to form the fourth boundary line 1042, and the fourth boundary line 1042 may be under the third blocking sub-dam 2021. Therefore, the both of first conductive layer 102 and the anode conductive layer 104 are shortened four times, and extend by a distance toward the fan-out region 20a after being shortened, so that a distance of a possibly formed moisture channel can be extended, and the invasion of moisture can be delayed, thereby preventing moisture from entering the display region 10 of the display substrate through the moisture channel and preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

In some embodiments, as shown in FIGS. 5*h* and 5*i*, the first conductive layer 102 further has a ninth connection line 1030 connecting the third boundary line 1022 and the ninth boundary line 1029, and a tenth connection line 1031 connecting the fifth boundary line 1024 and the ninth boundary line 1029. The anode conductive layer 104 further has an eleventh connection line 1050 connecting the fourth boundary line 1042 and the tenth boundary line 1049, and a twelfth connection line 1051 connecting the sixth boundary line 1044 and the tenth boundary line 1049. The eleventh connection line 1050 is located on a side of the ninth connection line 1030 close to the fan-out region 20*a*, and the twelfth connection line 1051 is located on a side of the tenth connection line 1031 close to the fan-out region 20*a*. An included angle between an extending direction of the ninth connection line 1030 and each of extending directions of the third boundary line 1022 and the ninth boundary line 1029 is greater than or equal to 90 degrees; an included angle between an extending direction of the tenth connection line 1031 and each of extending directions of the fifth boundary line 1024 and the ninth boundary line 1029 is greater than or equal to 90 degrees; an included angle between an extending direction of the eleventh connection line 1050 and each of extending directions of the fourth boundary line 1042 and the tenth boundary line 1049 is greater than or equal to 90 degrees; and an included angle between an extending direction of the twelfth connection line 1051 and each of extending directions of the sixth boundary line 1044 and the tenth boundary line 1049 is greater than or equal to 90 degrees.

As shown in FIG. 5*i*, the extending direction of the ninth connection line 1030 is neither perpendicular to the extending direction of the third boundary line 1022 nor perpendicular to the extending direction of the ninth boundary line 1029, and the extending direction of the tenth connection line 1031 is neither perpendicular to the extending direction of the fifth boundary line 1024 nor perpendicular to the extending direction of the ninth boundary line 1029. That is, both of the ninth connection line 1030 and the tenth connection line 1031 are arranged oblique, so that distances of the ninth connection line 1030 and the tenth connection line 1031 can be increased, a distance of a possibly formed moisture channel can be further extended, the invasion of moisture can be delayed, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. Similarly, the eleventh connection line 1050 and the twelfth connection line 1051 may also be arranged oblique, so that distances of the eleventh connection line 1050 and the twelfth connection line 1051 can be increased, a distance of a possibly formed moisture channel can be further extended, the invasion of moisture can be delayed, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate. As shown in FIG. 5*h*, each of the ninth connection line 1030, the tenth connection line 1031, the eleventh connection line 1050, and the twelfth connection line 1051 may alternatively be arranged perpendicular to a corresponding boundary line thereof, so that the difficulty in manufacturing the first conductive layer 102 and the anode conductive layer 104 may be reduced, the materials of the first conductive layer 102 and the anode conductive layer 104 may be saved, thereby saving the manufacturing cost.

Figure 6:
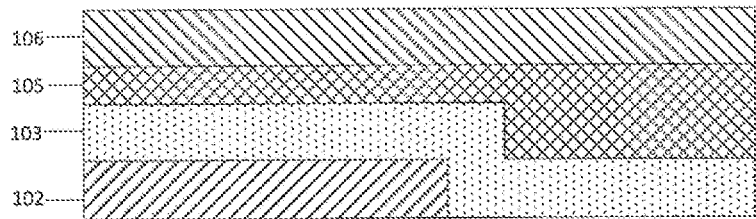
FIG. 6 is a schematic cross-sectional view illustrating a structure of the display substrates shown in FIGS. 5a to 5i along a line B-B'.

In some embodiments, as shown in FIG. 6, the display substrate further includes a pixel defining layer 105 on the anode conductive layer 104. A thickness of the pixel defining layer 105 is greater in the fan-out region 20*a* than in the corner region 20*b*.

As shown in FIG. 6, the thicknesses of the pixel defining layer 105 in different regions are different, and the pixel defining layer 105 is arranged on the anode conductive layer 104, so that the pixel defining layer 105 can perform a planarization function, and the thickness of the pixel defining layer 105 is thicker at a position where the first conductive layer 102 terminates and the second conductive layer 103 is continuously arranged. That is, the thickness of the pixel defining layer 105 is thicker in the fan-out region 20*a*, so that a step difference can be prevented from being generated, and thus, a crack can be prevented from being generated in a layer such as an encapsulation layer covering the pixel defining layer due to the step difference, and encapsulation failure can be prevented, thereby preventing moisture from entering the inside of the display substrate through a moisture channel, which can cause oxidation of an organic light-emitting layer of the light-emitting device to fail so that normal light emission cannot be performed.

Figure 7:
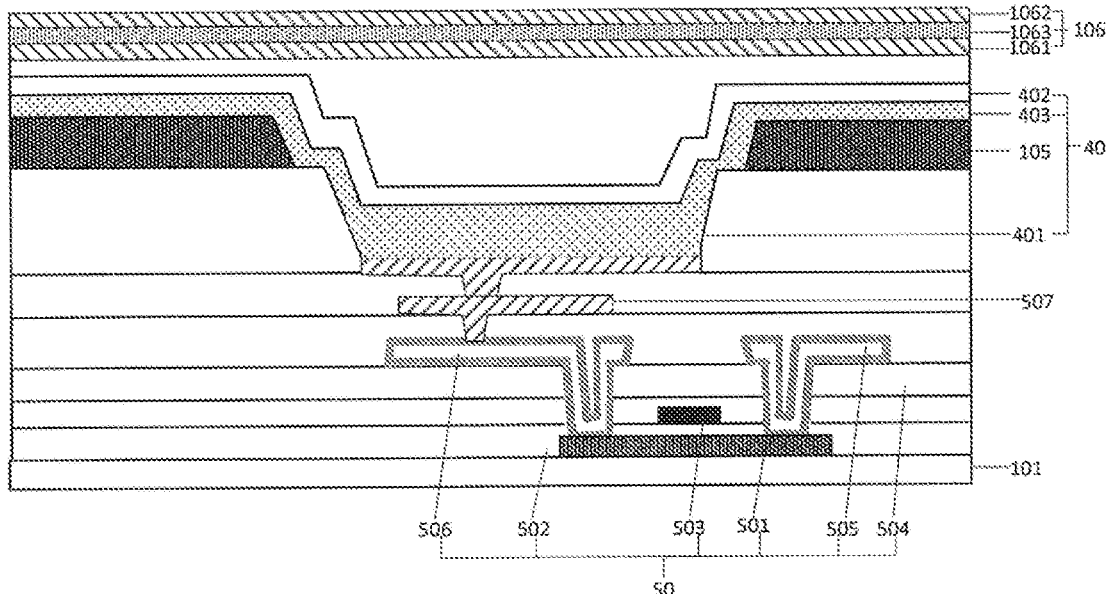
FIG. 7 is a schematic cross-sectional view illustrating a structure of the display substrates shown in FIGS. 4a to 4d along a line C-C'.

In some embodiments, as shown in FIG. 7, the display substrate further includes: a pixel circuit located between the base substrate 101 and the anode conductive layer 104 and arranged in the display region 10, and a light-emitting device 40 arranged in a region defined by the pixel defining layer 105. The pixel circuit includes a thin film transistor 50; and the thin film transistor 50 includes an active layer 501, a gate insulating layer 502, a gate 503, an interlayer insulating layer 504, and a source 505 and a drain 506, which are sequentially arranged on the base substrate 101. The light-emitting device 40 includes: a first electrode 401 and a second electrode 402 which are arranged opposite to each other, and an organic light-emitting layer 403 which is arranged between the first electrode 401 and the second electrode 402. The drain 506 is connected to the first electrode 401 through a transitional electrode 507; and the anode conductive layer 104 is arranged in a same layer as the first electrode 401.

The thin film transistor 50 includes the active layer 501, the gate insulating layer 502, the gate 503, the interlayer insulating layer 504, and the source/drain (including the source 505 and the drain 506) sequentially arranged on the base substrate 101, where the source 505 and the drain 506 are connected to two ends of the active layer 501 through vias penetrating through the interlayer insulating layer 504 and the gate insulating layer 503, respectively. The drain 506 of the thin film transistor 50 is connected to the first electrode 401 of the light-emitting device 40 through the transitional electrode 507, to provide the anode voltage signal to the light-emitting device 40. The transitional electrode 507 and the drain 506 may form a parallel structure, which may reduce the resistance of the electrode in the thin film transistor 50, and facilitate the transmission of the anode voltage signal.

The first electrode 401 of the light-emitting device 40 may be an anode, and may input an anode voltage signal to the light-emitting device to form holes. The anode may be exposed from the accommodating portion of the pixel defining layer 105. The anode and the anode conductive layer may be arranged in the same layer, and made of the same material through the same manufacturing process during manufacture, so that the process difficulty is reduced, and the manufacturing cost is saved. The second electrode 402 of the light-emitting device 40 may be a cathode, and may input a cathode voltage signal to the light-emitting device to form electrons. The cathode may cover the pixel defining layer 105, and in practical applications, the cathode may be arranged in a whole surface to facilitate the access of the cathode voltage signal. The organic light-emitting layer 403 of the light-emitting device 40 may be formed in the accommodating portion of the pixel defining layer 104 by an inkjet printing process using an organic light-emitting material. Excitons are formed by being driven by voltage signals of the anode and the cathode, to emit light.

The anode conductive layer 104 and the first electrode 401 may be arranged in the same layer, and made of the same material through the same manufacturing process during manufacture, so that the process difficulty is reduced, and the manufacturing cost is saved.

In some embodiments, the first conductive layer 102 and the source 505 and the drain 506 are arranged in the same layer; and the second conductive layer 103 and the transitional electrode 507 are arranged in the same layer.

The source 505 and the drain 506 of the thin film transistor 50 and the first conductive layer 102 may be arranged in the same layer, and may be made of the same material through the same manufacturing process during manufacture, so that the process difficulty is reduced, and the manufacturing cost is saved. Accordingly, the transitional electrode 507 and the second conductive layer 103 may be arranged in the same layer, and may be made of the same material through the same manufacturing process during manufacture, so that the process difficulty is reduced, and the manufacturing cost is saved.

In some embodiments, the display substrate further includes a power supply voltage line connected to the second electrode 402; and the power supply voltage line includes a first power supply voltage sub-line and a second power supply voltage sub-line. The first power supply voltage sub-line and the first conductive layer are arranged in the same layer; and the second power supply voltage sub-line and the second conductive layer are arranged in the same layer. Specifically, the power supply voltage line may be a low-level power supply voltage line VSS, and the low-level power supply voltage line VSS may be made of a double-layer structure of a first power supply voltage sub-line and a second power supply voltage sub-line, so as to reduce a resistance of the low-level power supply voltage line VSS and ensure transmission of a low-level power supply voltage signal. The first power supply voltage sub-line and the first conductive layer 102 may be arranged in the same layer, and the second power supply voltage sub-line and the second conductive layer 103 may be arranged in the same layer, and may be made of the same material through the same manufacturing process during manufacture, so that the process difficulty is reduced, and the manufacturing cost is saved.

Figure 8:
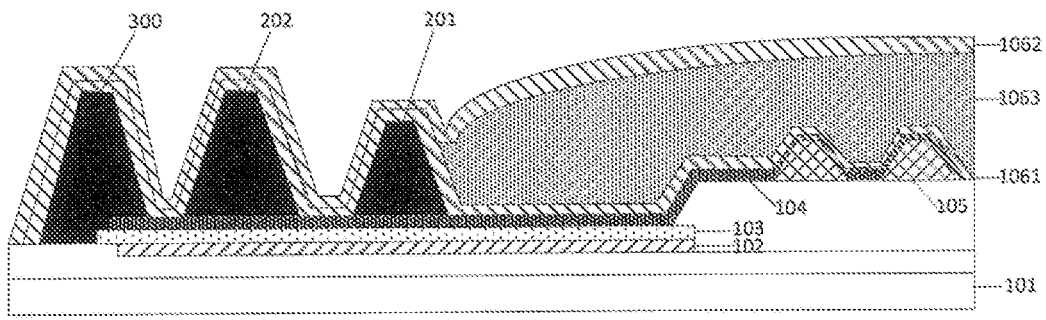
FIG. 8 is a schematic cross-sectional view illustrating a structure of the display substrate shown in FIG. 4b along a line D-D'.

In some embodiments, as shown in FIGS. 7 and 8, the display substrate further includes an encapsulation layer 106 located on the pixel defining layer 105; and the encapsulation layer 106 may include a first inorganic encapsulation layer 1061, an organic encapsulation layer 1063, and a second inorganic encapsulation layer 1062, which are sequentially arranged along a direction away from the base substrate 101. The first inorganic encapsulation layer 1061 and the second inorganic encapsulation layer 1062 cover the blocking structure 200, and terminate on a side of the blocking structure 200 away from the display region 10. The organic encapsulation layer 1062 terminates on a side of the blocking structure 200 close to the display region 10.

The encapsulation layer 106 may encapsulate the second electrode 402 of the light-emitting device 40, so as to prevent moisture from entering the organic light-emitting layer 403 of the light-emitting device, and prevent the organic light-emitting layer 403 from being oxidized and prevent the poor display. Specifically, the encapsulation layer 106 may include the first inorganic encapsulation layer 1061, the organic encapsulation layer 1063, and the second inorganic encapsulation layer 1062 which are sequentially arranged along a direction away from the base substrate 101. The first inorganic encapsulation layer and the second inorganic encapsulation layer may be made of an inorganic material such as silicon nitride, silicon oxide, or silicon oxynitride, and the organic encapsulation layer may be made of an organic material such as epoxy resin. Meanwhile, the first inorganic encapsulation layer 1061 and the second inorganic encapsulation layer 1062 of the encapsulation layers 106 may cover the blocking structure 200, and terminate on a side of the blocking structure 200 away from the display region 10. Where an intercepting structure is arranged on a side of the blocking structure 200 away from the display region 10, the first inorganic encapsulation layer 1061 and the second inorganic encapsulation layer 1062 terminate at a position of the intercepting structure. The organic encapsulation layer 1062 terminates on a side of the blocking structure 200 close to the display region 10, so that moisture may be prevented from being conducted from the non-display region 20 to the display region 10 through the organic encapsulation layer 1063 in the display region 10.

In some embodiments, the display substrate further includes a first organic insulating layer (not shown) and a second organic insulating layer (not shown). The first organic insulating layer is located between the first conductive layer and the second conductive layer; and the second organic insulating layer is located between the second conductive layer and the anode conductive layer.

On one hand, the first organic insulating layer can insulate the first conductive layer 102 from the second conductive layer 103, so that the first conductive layer and the second conductive layer are prevented from being short-circuited in a corresponding region, and signal transmission is not affected; on the other hand, the first organic insulating layer can cover the first conductive layer 102, so that moisture is prevented from corroding the first conductive layer 102. Similarly, the second organic insulating layer may also insulate the second conductive layer 103 from the anode conductive layer 104, so that the second conductive layer 103 and the anode conductive layer are prevented from being short-circuited in a corresponding region and signal transmission is not affected; on the other hand, the second organic insulating layer may cover the second conductive layer 103, so that moisture is prevented from corroding the second conductive layer 103.

In some embodiments, the first organic insulating layer and the second organic insulating layer are each provided with a groove in a corresponding region between the intercepting structure and the blocking structure.

The groove may allow the first organic insulating layer and second organic insulating layer each break at the corresponding position, so that a moisture channel may be prevented from being formed between the intercepting structure 300 and the blocking structure 200, therefore moisture can be prevented from entering the display region 10 of the display substrate through the moisture channel, thereby preventing the failure of the organic light-emitting layer of the light-emitting device from being caused by the moisture, so that the defect of a continuously enlarged dark spot is prevented from occurring due to the failure of the organic light-emitting layer, thereby improving the display effect of the display substrate.

Figure 5J:
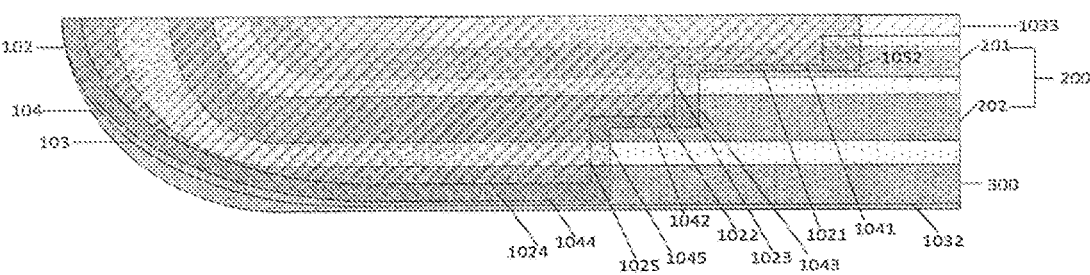
FIG. 5j is a schematic diagram illustrating an enlarged structure of a corner region of the display substrate shown in FIG. 4b.

In some embodiments, as shown in FIG. 5*j*, the second conductive layer 103 has an eleventh boundary line 1032. In the corner region 20*b*, the eleventh boundary line 1032 is located on a side of the sixth boundary line 1044 away from the display region 10.

It is to be understood that in FIGS. 5*a* to 5*i*, in order to more clearly show the position relationship between the boundary lines and the connection lines of the first conductive layer 102 and the anode conductive layer 104, the structure of the second conductive layer 103 is not shown. In FIG. 5*j*, the structure of the second conductive layer 103 is shown. As shown in FIG. 5*j*, in the corner region 20*b*, the eleventh boundary line 1032 of the second conductive layer 103 is located on the side of the sixth boundary line 1044 away from the display region 10, so that the second conductive layer 103 can cover the sixth boundary line of the anode conductive layer 104 and the fifth boundary line 1024 of the first conductive layer 102, and damage to the first conductive layer 102 can be prevented when etching the second conductive layer 103.

In some embodiments, as shown in FIGS. 5*a* to 5*j*, the first conductive layer 102 further has a twelfth boundary line 1033 intersecting an extending direction of the first boundary line 1021; and the anode conductive layer 104 further has a thirteen boundary lines 1052 intersecting an extending direction of the second boundary line 1041. The twelfth boundary line 1033 is located in the fan-out region 20*a*, and the thirteenth boundary line 1052 is located in the corner region 20*b*.

The twelfth boundary line 1033 of the first conductive layer 102 may extend from the fan-out region 20*a* to the display region 10, and the thirteenth boundary line 1052 of the anode conductive layer 104 may extend from the corner region 20*b* to the display region 10, to supply a low-level power signal to the light-emitting device 40 in the display region 10.

In some embodiments, as shown in FIG. 8, at least portions of the first conductive layer 102, the second conductive layer 103, and the anode conductive layer 104 are electrically connected together in the corner region 20*b*.

In the corner region 20*b*, the first conductive layer 102 and the second conductive layer 103 are electrically connected together, to form a low-level power supply voltage line VSS with a double-layer structure. The low-level power supply voltage line VSS is connected to the anode conductive layer 104, and the anode conductive layer 104 extends from the corner region 20*b* to the display region 10 and is connected to the cathode of the light-emitting device 40 in the display region 10, to provide a low-level power supply signal to the light-emitting device in the display region 10, so that the light-emitting device 40 emits light to realize a display function.

An embodiment of the present disclosure further provides a display apparatus, which includes the display substrate according to any of the above embodiments. The display apparatus may be any product or component having a display function, such as a mobile phone, a tablet computer, a television, a monitor, a notebook computer, a digital photo frame, a navigator, or the like, which is not limited by the embodiment of the present disclosure. The implementation principle and technical effect of the display apparatus are the same as those of the display substrate according to any of the above embodiments, and are not described herein again.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without away from the spirit and scope of the present disclosure, and such modifications and improvements are also considered to be within the scope of the present disclosure.

What is claimed is:

1. A display substrate having a display region and a non-display region surrounding the display region, wherein the display substrate comprises a base substrate and a blocking structure on the base substrate and in the non-display region; the display substrate further comprises a first conductive layer, a second conductive layer, and an anode conductive layer, which are on the base substrate and sequentially arranged along a direction away from the base substrate; the first conductive layer has a first boundary line; the anode conductive layer has a second boundary line, which has an extending direction substantially parallel to an extending direction of the first boundary line; the second boundary line is on a side of the first boundary line away from the display region; the non-display region comprises a fan-out region on a side of the display region, and a corner region connected to the fan-out region;

in the fan-out region, the first conductive layer terminates, and the second conductive layer is continuously arranged; and in the corner region, the anode conductive layer terminates, and an orthographic projection of the blocking structure on the base substrate at least partially covers an orthographic projection of each of the first boundary line and the second boundary line on the base substrate.

2. The display substrate according to claim 1, wherein the blocking structure comprises a first blocking dam; and an orthographic projection of the first blocking dam on the base substrate at least partially covers the orthographic projection of the first boundary line and the second boundary line on the base substrate.

3. The display substrate according to claim 1, wherein the first conductive layer further has a third boundary line, which has an extending direction substantially parallel to the extending direction of the first boundary line; the third boundary line is on a side of the first boundary line away from the display region; and the anode conductive layer further has a fourth boundary line, which has an extending direction substantially parallel to the extending direction of the second boundary line; the fourth boundary line is located on a side of the second boundary line away from the display region, and the fourth boundary line is located on a side of the third boundary line away from the display region.

4. A display substrate according to claim 3, wherein the blocking structure further comprises a second blocking dam on a side of the first blocking dam away from the display region; and an orthographic projection of the second blocking dam on the base substrate at least partially covers an orthographic projection of each of the third boundary line and the fourth boundary line on the base substrate.

5. The display substrate according to claim 3, wherein the first conductive layer further has a first connection line connecting the first boundary line and the third boundary line; the anode conductive layer further has a second connection line connecting the second boundary line and the fourth boundary line; the second connection line is located on a side of the first connection line close to the fan-out region;

an included angle between an extending direction of the first connection line and each of the extending directions of the first boundary line and the third boundary line is greater than or equal to 90 degrees; and an included angle between an extension direction of the second connection line and each of the extending directions of the second boundary line and the fourth boundary line is greater than or equal to 90 degrees.

6. The display substrate according to claim 4, w wherein the first conductive layer further has a fifth boundary line, which has an extending direction substantially parallel to the extending direction of the third boundary line; the fifth boundary line is on a side of the third boundary line away from the display region; and the anode conductive layer further has a sixth boundary line, which has an extending direction substantially parallel to the extending direction of the fourth boundary line; the sixth boundary line is located on a side of the fourth boundary line away from the display region, and the sixth boundary line is located on a side of the fifth boundary line away from the display region.

7. The display substrate according to claim 6, wherein the display substrate further comprises an intercepting structure on the base substrate and in the non-display region; and the intercepting structure is farther from the display region than the second blocking dam.

8. The display substrate according to claim 7, wherein an orthographic projection of the intercepting structure on the base substrate at least partly covers an orthographic projection of each of the fifth boundary line and the sixth boundary line on the base substrate.

9. The display substrate according to claim 6, wherein the first conductive layer further has a third connection line connecting the third boundary line and the fifth boundary line; the anode conductive layer further has a fourth connection line connecting the fourth boundary line and the sixth boundary line; the fourth connection line is located on a side of the third connection line close to the fan-out region;

an included angle between an extending direction of the third connection line and each of the extending directions of the third boundary line and the fifth boundary line is greater than or equal to 90 degrees; and an included angle between an extending direction of the fourth connection line and each of the extending directions of the fourth boundary line and the extending direction of the sixth boundary line is greater than or equal to 90 degrees.

10. The display substrate according to claim 3, wherein the first conductive layer further has a seventh boundary line substantially, which has an extending direction parallel to the extending direction of the third boundary line; the seventh boundary line is between the first boundary line and the third boundary line; and the anode conductive layer further has an eighth boundary line, which has an extending direction substantially parallel to the extending direction of the fourth boundary line; the eighth boundary line is between the second boundary line and the fourth boundary line, and the eighth boundary line is on a side of the seventh boundary line away from the display region.

11. The display substrate according to claim 10, wherein the first blocking dam comprises a first blocking sub-dam and a second blocking sub-dam; the first blocking sub-dam is closer to the display region than the second blocking sub-dam;

an orthographic projection of the first blocking sub-dam on the base substrate at least partially covers the orthographic projection of the first boundary line and the second boundary line on the base substrate; and an orthographic projection of the second blocking sub-dam on the base substrate at least partially covers an orthographic projection of each of the seventh boundary line and the eighth boundary line on the base substrate.

12. The display substrate according to claim 10, wherein the first conductive layer further has a fifth connection line connecting the first boundary line and the seventh boundary line, and a sixth connection line connecting the third boundary line and the seventh boundary line; the anode conductive layer further has a seventh connection line connecting the second boundary line and the eighth boundary line, and an eighth connection line connecting the fourth boundary line and the eighth boundary line; the seventh connection line is on a side of the fifth connection line close to the fan-out region, and the eighth connection line is on a side of the sixth connection line close to the fan-out region;

an included angle between an extending direction of the fifth connection line and each of the extending directions of the first boundary line and the seventh boundary line is greater than or equal to 90 degrees; an included angle between an extending direction of the sixth connection line and each of the extending directions of the third boundary line and the seventh boundary line is greater than or equal to 90 degrees; and an included angle between an extending direction of the seventh connection line and each of the extending directions of the second boundary line and the eighth boundary line is greater than or equal to 90 degrees; and an included angle between an extending direction of the eighth connection line and each of the extending directions of the fourth boundary line and the extending direction of the eighth boundary line is greater than or equal to 90 degrees.

13. The display substrate according to claim 6, wherein the first conductive layer further has a ninth boundary line, which has an extending direction substantially parallel to the extending direction of the third boundary line; the ninth boundary line is on a side of the third boundary line away from the display region; and the anode conductive layer further has a tenth boundary line, which has an extending direction substantially parallel to the extending direction of the fourth boundary line; the tenth boundary line is on a side of the fourth boundary line away from the display region, and the tenth boundary line is on a side of the ninth boundary line away from the display region.

14. The display substrate according to claim 13, wherein the second blocking dam comprises a third blocking sub-dam and a fourth blocking sub-dam; the third blocking sub-dam is closer to the display region than the fourth blocking sub-dam;

an orthographic projection of the third blocking sub-dam on the base substrate at least partially covers the orthographic projection of the third boundary line and the fourth boundary line on the base substrate; and an orthographic projection of the fourth blocking sub-dam on the base substrate at least partially covers an orthographic projection of each of the ninth boundary line and the tenth boundary line on the base substrate.

15. The display substrate according to claim 13, wherein the first conductive layer further has a ninth connection line connecting the third boundary line and the ninth boundary line, and a tenth connection line connecting the fifth boundary line and the ninth boundary line; the anode conductive layer further has an eleventh connection line connecting the fourth boundary line and the tenth boundary line, and a twelfth connection line connecting the sixth boundary line and the tenth boundary line; the eleventh connection line is on a side of the ninth connection line close to the fan-out region, and the twelfth connection line is on a side of the tenth connection line close to the fan-out region;

an included angle between an extending direction of the ninth connection line and each of the extending directions of the third boundary line and the ninth boundary line is greater than or equal to 90 degrees; an included angle between an extending direction of the tenth connection line and each of the extending directions of the fifth boundary line and the ninth boundary line is greater than or equal to 90 degrees;

an included angle between an extending direction of the eleventh connection line and each of the extending directions of the fourth boundary line and the tenth boundary line is greater than or equal to 90 degrees; an included angle between an extending direction of the twelfth connection line and each of the extending directions of the sixth boundary line and the tenth boundary line is greater than or equal to 90 degrees.

16. The display substrate according to claim 1, wherein the display substrate further comprises a pixel defining layer on the anode conductive layer; and a thickness of the pixel defining layer is greater in the fan-out region than in the corner region.

17. The display substrate according to claim 6, wherein the second conductive layer has an eleventh boundary line; and in the corner region, the eleventh boundary line is on a side of the sixth boundary line away from the display region.

18. The display substrate according to claim 1, wherein the first conductive layer further has a twelfth boundary line intersecting the extending direction of the first boundary line; the anode conductive layer further has a thirteen boundary line intersecting the extending direction of the second boundary line; and the twelfth boundary line is in the fan-out region, and the thirteenth boundary line is in the corner region.

19. The display substrate according to claim 1, wherein at least portions of the first conductive layer, the second conductive layer, and the anode conductive layer are electrically connected together in the corner region.

20. A display apparatus, comprising the display substrate according to claim 1.

* * * * *